(12) United States Patent
Shimizu et al.

(10) Patent No.: US 7,459,719 B2
(45) Date of Patent: Dec. 2, 2008

(54) SUPERLATTICE OPTICAL SEMICONDUCTOR DEVICE WHERE EACH BARRIER LAYER HAS HIGH CONTENT OF GROUP III ELEMENTS IN CENTER PORTION AND LOW CONTENT NEAR WELL LAYER

(75) Inventors: Jun Shimizu, Kyoto (JP); Tetsuzo Ueda, Osaka (JP); Toshikazu Onishi, Kyoto (JP)

(73) Assignee: Panasonic Corporation, Osaka (JP)

( * ) Notice: Subject to any disclaimer, the term of this patent is extended or adjusted under 35 U.S.C. 154(b) by 98 days.

(21) Appl. No.: 11/304,816

(22) Filed: Dec. 16, 2005

(65) Prior Publication Data

US 2006/0131557 A1 Jun. 22, 2006

(30) Foreign Application Priority Data

Dec. 17, 2004 (JP) ............................. 2004-365719

(51) Int. Cl.
*H01L 29/06* (2006.01)
(52) U.S. Cl. ............................. 257/15; 257/14; 257/18; 257/21; 257/22; 257/E33.023
(58) Field of Classification Search .................. 257/15, 257/E33.023, 14, 18, 21, 22
See application file for complete search history.

(56) References Cited

U.S. PATENT DOCUMENTS 5,170,407 A * 12/1992 Schubert et al. ............... 372/96
5,568,499 A * 10/1996 Lear ........................ 372/45.01
6,689,631 B2 * 2/2004 Chang ........................... 438/29
6,693,933 B2 * 2/2004 Strzelecki ................. 372/43.01

FOREIGN PATENT DOCUMENTS

JP 09-162482 6/1997

OTHER PUBLICATIONS

DuPont Kapton CR Polyimide Film fact sheet, 6 pages.*
S.D. Roh et al, Wiley Encyclopedia of Electrical and Electronics Engineering, Distributed Bragg Reflector Lasers article, 1999, 15 pages.*
A. Zaslavsky, Wiley Encyclopedia of Electrical and Electronics Engineering, Quantum Devices article, 1999, 29 pages.*
Choquette, et al., "GaAs Vertical-Cavity Surface Emitting lasers Fabricated by Reactive Ion Etching", IEEE Photonics Technology Letters, vol. 3, No. 10, Oct. 1991.

* cited by examiner

*Primary Examiner*—Thanh V Pham
*Assistant Examiner*—Alexander Belousov
(74) *Attorney, Agent, or Firm*—McDermott Will & Emery LLP

(57) ABSTRACT

An optical semiconductor device includes an active layer having a quantum well structure including alternately stacked well layers and barrier layers with a larger band gap than the well layers. The band gap of each of the well layers and the barrier layers is constant, each well layer is uniformly provided with compression strain and each barrier layer is provided with large extension strain in a center portion thereof along the thickness direction and small extension strain in portions thereof in the vicinity of the well layers.

8 Claims, 3 Drawing Sheets

SUPERLATTICE OPTICAL SEMICONDUCTOR DEVICE WHERE EACH BARRIER LAYER HAS HIGH CONTENT OF GROUP III ELEMENTS IN CENTER PORTION AND LOW CONTENT NEAR WELL LAYER

CROSS-REFERENCE TO RELATED APPLICATIONS

This application claims priority under 35 U.S.C. §119 on Patent Application Nos. 2004-365719 and 2005-358906 filed in Japan respectively on Dec. 17, 2004 and Dec. 13, 2005, the entire contents of which are hereby incorporated by reference.

BACKGROUND OF THE INVENTION

The present invention relates to an optical semiconductor device having a strain compensation quantum well structure including a compression strain quantum well layer and an extension strain barrier layer, and a method for fabricating the same.

Recently, a surface emitting type semiconductor laser device expected to have a large number of advantages, over an edge emitting type semiconductor laser device, such as a low operation current, a high degree of integration through two-dimensional array arrangement and a low cost is being earnestly developed. In particular, use of a gallium arsenic (GaAs)-based compound semiconductor material with an oscillation wavelength of 850 nm or more has been studied and developed for short-distance fast optical communication such as Gigabit Ethernet (registered trademark) or optical data links, and such technique has already been commercialized.

A previously reported surface emitting type semiconductor laser device of a 850 nm band employs, as an active layer, an aluminum gallium arsenide (AlGaAs)-based multiple quantum well structure (for example, see IEEE Photon. Technol. Lett., vol. 3, 1991, pp. 859-862). In this conventional device, for example, GaAs is used as a well layer and $Al_{0.3}Ga_{0.7}As$ is used as a barrier layer.

As means for further increasing optical gain in an active layer of a semiconductor laser device and for realizing a smaller threshold current in the resultant semiconductor laser device, what is called a strain compensation quantum well active layer including a well layer provided with compression strain and a barrier layer provided with extension strain has recently been proposed (for example, see Japanese Laid-Open Patent Publication No. 9-162482).

When a well layer of the quantum well structure is provided with the compression strain, degeneration of a valence band is relieved owing to the compression effect, and hence, the state density of holes is lowered. The lowering of the state density of holes reduces the effective mass of the holes and the holes can be easily recombined with electrons. Therefore, the optical gain is increased, resulting in lowering the threshold current and increasing the efficiency of optical output. In addition, when the barrier layer is provided with the extension strain, the compression strain of the well layer is relieved, so that crystallinity degradation such as misfit dislocation can be suppressed. However, even when the Al composition of an AlGaAs-based material is changed, its lattice constant is minimally changed, and hence stress strain is minimally caused in the active layer.

Therefore, for realizing the oscillation frequency of 850 nm, a strain compensation quantum well active layer using, as the well layer, $Al_xGa_yIn_{1-x-y}As$ (wherein $0<x$, $y<1$ and $0<x+y<1$) obtained by adding indium (In) to an AlGaAs-based compound semiconductor and, as the barrier layer, $Al_xGa_{1-x}As_yP_{1-y}$ (wherein $0<x$ and $y<1$) obtained by adding phosphorus (P) to the AlGaAs-based compound semiconductor has been proposed. When such a quantum well active layer with stress strain is used, a surface emitting type semiconductor laser device with a small threshold current can be realized.

SUMMARY OF THE INVENTION

In forming the multilayered structure of the AlGaInAs (well layer) and AlGaAsP (barrier layer) of the aforementioned conventional strain compensation quantum well structure, when, for example, metal organic chemical vapor deposition (MOCVD) widely used in crystal growth of a compound semiconductor is employed, it is necessary to supply, as group V material gases, arsine ($AsH_3$) alone in growing the well layer and both arsine ($AsH_3$) and phosphine ($PH_3$) in growing the barrier layer. Since it takes some time to switch these group V material gases, the crystal growth is interrupted when the growth process for the well layer is switched to the growth process for the barrier layer or when the growth process for the barrier layer is switched to the growth process for the well layer. During this interruption of the crystal growth, arsenic (As) or phosphorus (P) corresponding to the group V element is released from the crystal, and therefore, it is very difficult to switch the group V material gases for making the composition of the group V elements abruptly changed on the interface between the well layer and the barrier layer.

In other words, since the controllability of the composition of the group V elements included in the strain compensation quantum well structure is low, it is difficult to obtain a high-gain active layer with desired crystal strain.

An object of the invention is improving the controllability of composition of group V elements included in a strain compensation quantum well structure for realizing a high-gain active layer by overcoming the aforementioned conventional problem.

In order to achieve the object, in an optical semiconductor device of this invention, extension strain caused in a barrier layer of a quantum well structure composed of a well layer and the barrier layer is increased in a center portion along the thickness direction and reduced in a portion in the vicinity of the well layer.

For example, in a strain compensation quantum well structure including, in an active layer, a well layer of AlGaInAs and a barrier layer of AlGaAsP, a composition ratio of phosphorus (P) added in the barrier layer for causing extension strain is reduced in the vicinity of the well layer and is increased in a center portion of the barrier layer along the thickness direction. In this manner, a supply amount of phosphorus (P) can be gradually increased from the start of the crystal growth and gradually reduced before the end of the crystal growth while continuously supplying arsenic (As), that is, another group V element, between the growth process for the well layer and the growth process for the barrier layer, and thus, the growth process for the well layer and the growth process for the barrier layer can be continuously performed. Accordingly, the group V elements can be prevented from releasing from the crystal during interruption between the growth process for the well layer and the growth process for the barrier layer, and hence, the controllability of the composition of the group V elements can be improved so as to realize a high-gain active layer.

Specifically, the optical semiconductor device of this invention includes an active layer having a quantum well structure including alternately stacked well layers and barrier layers with a larger band gap than the well layers, and each of the well layers and the barrier layers has a constant band gap, and each of the well layers is uniformly provided with compression strain and each of the barrier layers is provided with large extension strain in a center portion thereof along a thickness direction and small extension strain in portions thereof in the vicinity of the well layers.

In the optical semiconductor device of this invention, a strain compensation quantum well structure realizing both a desired band gap and desired strain can be obtained. In other words, since the controllability of the semiconductor composition on the interface between the well layer and the barrier layer of the active layer having the strain compensation quantum well structure can be improved, the active layer can attain high gain.

In the optical semiconductor device of the invention, the active layer is preferably made of a group III-V compound semiconductor, a composition ratio of each of group III elements and group V elements is preferably uniform in each of the well layers regardless of a position therein, and a composition ratio of each of group III elements and group V elements is preferably varied along the thickness direction in each of the barrier layers. Thus, a desired band gap and desired strain can be attained in using the active layer made of the group III-V compound semiconductor.

In the optical semiconductor device of the invention, the extension strain provided to each of the barrier layers is preferably distributed symmetrically along the thickness direction.

In this case, each of the well layers is preferably made of AlGaInAs and each of the barrier layers is made of AlGaAsP, and composition ratios of the AlGaAsP are preferably modulated in each of the barrier layers.

In this case, a composition ratio of P in the AlGaAsP of each of the barrier layers is preferably high in the center portion thereof along the thickness direction and low in the portions thereof in the vicinity of the well layers.

In this case, a composition ratio of Ga in the AlGaAsP of each of the barrier layers is preferably high in the center portion thereof along the thickness direction and low in the portions thereof in the vicinity of the well layers. Thus, variation of the band gap caused by the composition modulation of the group V elements, that is, As and P, can be compensated by the composition modulation of the group III elements, that is, Al and Ga, and therefore, the band gap of the barrier layer can be constant.

In the optical semiconductor device of the invention, in the case where the active layer is made of a group III-V compound semiconductor, the active layer is preferably formed over a substrate made of GaAs.

In this case, the optical semiconductor of the invention preferably further includes a first reflecting layer and a second reflecting layer each made of a multilayered film of AlGaAs and together sandwiching the active layer along the thickness direction.

When each well layer is made of AlGaInAs and each barrier layer is made of AlGaAsP, the optical semiconductor device of the invention preferably further includes an oxidized layer formed by oxidizing AlGaAs in at least one of a position between the active layer and the first reflecting layer and a position between the active layer and the second reflecting layer, and a composition ratio of Al in the oxidized layer is preferably higher than in the well layers, the barrier layers, the first reflecting layer and the second reflecting layer.

In this case, the active layer, the first reflecting layer and the second reflecting layer are preferably formed in the shape of a column, a first electrode and a second electrode are preferably respectively formed above and below the active layer in the shape of a column, and emitted light from the active layer generated by a current injected from the first electrode or the second electrode is preferably taken out through the first reflecting layer or the second reflecting layer.

In this case, the optical semiconductor device of the invention preferably further includes a dielectric film with a dielectric constant smaller than 4 formed around the active layer, the first reflecting layer and the second reflecting layer formed in the shape of a column. Thus, the parasitic capacitance of the dielectric film formed for burying the active layer and the like formed in the shape of a column can be reduced, so that the optical semiconductor device can more easily perform a fast operation.

In this case, the dielectric film is preferably made of benzocyclobutene (BCB).

The method of this invention for fabricating an optical semiconductor device made of a group III-V compound semiconductor, includes the steps of (a) forming a well layer over a substrate; (b) forming a barrier layer with a larger band gap than the well layer on the well layer; and (c) forming an active layer with a quantum well structure including the well layer and the barrier layer alternately stacked by repeating the step (a) and the step (b) a plurality of times, and the well layer is uniformly provided with compression strain and the barrier layer is provided with large extension strain in a center portion thereof along a thickness direction and small extension strain in a portion thereof in the vicinity of the well layer by forming the well layer with composition ratios of group III elements and group V elements being constant in the step (a) and by forming the barrier layer with composition ratios of group III elements and group V elements being varied along a thickness direction in the step (b).

According to the method for fabricating an optical semiconductor device of this invention, the aforementioned optical semiconductor device of the invention can be realized.

In the method for fabricating an optical semiconductor device of the invention, the well layer is preferably formed by using AlGaInAs in the step (a), the barrier layer is preferably formed by using AlGaAsP in the step (b), and a composition ratio of P in the AlGaAsP of the barrier layer is preferably high in the center portion thereof along the thickness direction and low in the portion thereof in the vicinity of the well layer.

In the method for fabricating an optical semiconductor device of the invention, a composition ratio of Ga in the AlGaAsP of the barrier layer is preferably high in the center portion thereof along the thickness direction and low in the portion thereof in the vicinity of the well layer in the step (b).

In the method for fabricating an optical semiconductor device of the invention, the step (a) and the step (b) are preferably continuously performed. Thus, the composition of the group V elements on the interface between the well layer and the barrier layer can be definitely controlled in accordance with a designed value, and therefore, the active layer can attain strain compensation quantum well structure with high crystallinity.

In the method for fabricating an optical semiconductor device of the invention, the step (a) and the step (b) are preferably performed by metal organic chemical vapor deposition.

In the method for fabricating an optical semiconductor device of the invention, arsine is preferably used as an As material in the step (a), and arsine is preferably used as an As material and phosphine is preferably used as a P material in the step (b).

DETAILED DESCRIPTION OF THE INVENTION

Embodiment

An embodiment of the invention will now be described with reference to the accompanying drawings.

Figure 1:
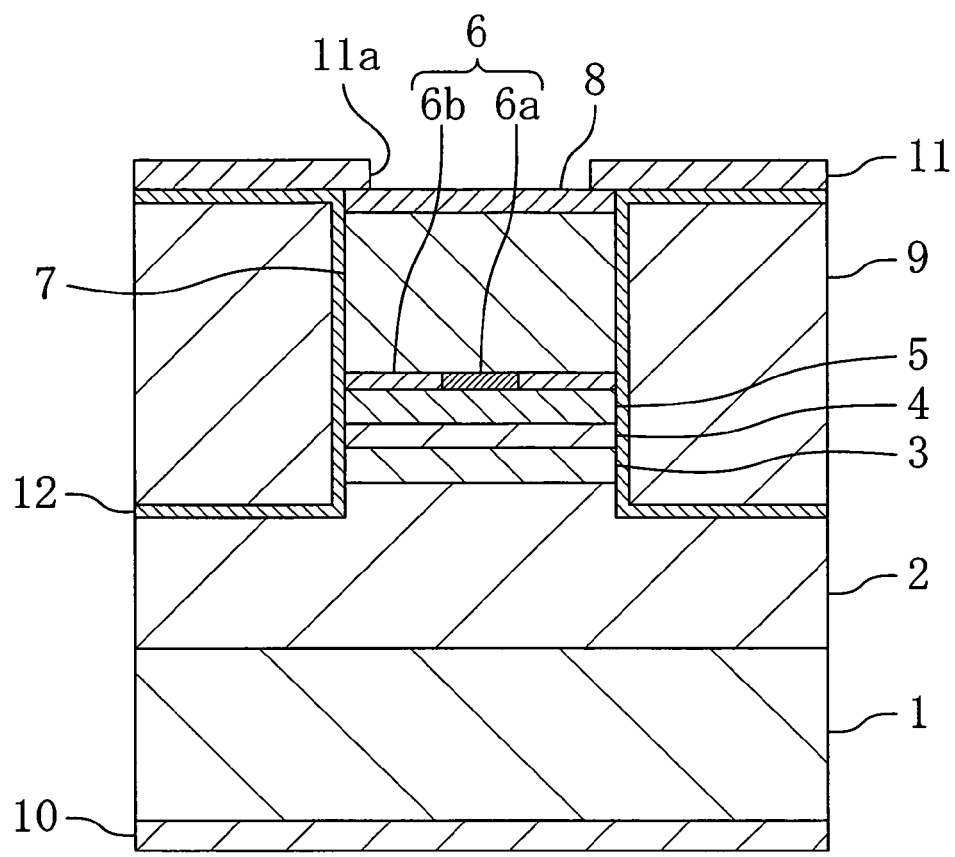
FIG. 1 is a cross-sectional view of an optical semiconductor device according to an embodiment of the invention.

FIG. 1 schematically shows the cross-sectional structure of an optical semiconductor device of this embodiment, that is, a surface emitting type semiconductor laser device including an active layer with a strain compensation quantum well structure.

As shown in FIG. 1, the surface emitting type semiconductor laser device of this embodiment includes a substrate 1 of GaAs with an n-type conductivity, and a first reflecting mirror layer 2 of n-type AlGaAs, a first spacer layer 3 of undoped $Al_{0.6}Ga_{0.4}As$, a quantum well active layer 4 of AlGaInAs/AlGaAsP, a second spacer layer 5 of undoped $Al_{0.6}Ga_{0.4}As$, a current confining layer 6, a second reflecting mirror layer 7 of p-type AlGaAs and a contact layer 8 of p-type GaAs successively formed on the substrate 1. In this case, the spacer layers 3 and 5 function as light guiding layers.

Each of the first reflecting mirror layer 2 and the second reflecting mirror layer 7 has a multilayered structure composed of a high-refractive index layer of $Al_{0.12}Ga_{0.88}As$ and a low-refractive index layer of $Al_{0.9}Ga_{0.1}As$. Each of the high-refractive index layer and the low-refractive index layer has a thickness of λ/4n (wherein λ is an oscillation wavelength and n is a refractive index). When a combination of one high-refractive index layer and one low-refractive index layer is designated as a pair of layers, the first reflecting mirror layer 2 includes 34.5 pairs of layers and the second reflecting mirror layer 7 includes 22.5 pairs of layers, whereas 0.5 pair of layers means either the high-refractive index layer or the low-refractive index layer provided as the uppermost or lowermost layer of the reflecting mirror layer 2 or 7.

The current confining layer 6 includes a current aperture region 6a of p-type $Al_{0.98}Ga_{0.02}As$ and a current confining region 6b formed by oxidizing a peripheral portion of the current aperture region 6a. Although the current confining layer 6 is provided between the second spacer layer 5 and the second reflecting mirror layer 7 in this embodiment, it may be provided in at least one of a position between the first reflecting mirror layer 2 and the first spacer layer 3 and a position between the second spacer layer 5 and the second reflecting mirror layer 7.

An upper portion of the first reflecting mirror layer 2, the first spacer layer 3, the quantum well active layer 4, the second spacer layer 5, the current confining layer 6, the second reflecting mirror layer 7 and the contact layer 8 are formed in the shape of a column (post), and this column-shaped portion is surrounded with a burying layer 9 of benzocyclobutene (BCB) with a protecting film 12 of silicon oxide ($SiO_2$) sandwiched therebetween.

An n-type electrode 10 made of an alloy or a multilayered film of gold (Au), germanium (Ge) and nickel (Ni) is formed on a face of the substrate 1 opposite to the first reflecting mirror layer 2. Also, a p-type electrode 11 made of an alloy or a multilayered film of titanium (Ti), platinum (Pt) and gold (Au) and having an opening 11a whose inner edge is in contact with the peripheral portion of the contact layer 8 in a circular shape in the plan view is formed on the burying layer 9 with the protecting film 12 sandwiched therebetween.

Now, a method for fabricating the surface emitting type semiconductor laser device having the aforementioned structure will be described.

First, a first reflecting mirror layer 2 of n-type AlGaAs, a first spacer layer 3 of undoped $Al_{0.6}Ga_{0.4}As$, a quantum well active layer 4 of AlGaInAs/AlGaAsP, a second spacer layer 5 of undoped $Al_{0.6}Ga_{0.4}As$, a current confinement forming layer of p-type $Al_{0.98}Ga_{0.02}As$, a second reflecting mirror layer 7 of p-type AlGaAs and a contact layer 8 of p-type GaAs are successively epitaxially grown on a substrate 1 of n-type GaAs by MOCVD. At this point, for example, trimethyl gallium (TMG), trimethyl aluminum (TMA) and trimethyl indium (TMI) are used as group III element sources of Ga, Al and In, respectively. Also, for example, arsine ($AsH_3$) and phosphine ($PH_3$) are used as group V element sources of As and P, respectively.

Next, the epitaxially grown semiconductor layers are selectively etched down to the first reflecting mirror layer 2 by lithography and dry etching using a gas including chlorine ($Cl_2$) as a principal component, thereby forming a column-shaped operation region.

Then, the column-shaped operation region is subjected to steam oxidation, thereby selectively forming a current confining region 6b in a peripheral portion of the current confinement forming layer, and thus, a current aperture region 6a is formed at the center of the current confinement forming layer. In this case, the composition of the current confinement forming layer is $Al_{0.98}Ga_{0.02}As$, and the current confinement region 6b is formed by utilizing a property that a region with a larger Al composition ratio is more easily steam oxidized than a region with a lower Al composition ratio.

Next, BCB with a small dielectric constant is applied on the substrate 1 by spin coating so as to bury a portion around the column-shaped operation region and the buried BCB is cured, thereby forming a burying layer 9. Thereafter, sputtering or vacuum deposition is employed for forming an n-type electrode 10 on the rear face of the substrate 1 and a p-type electrode 11 on the burying layer 9 including a peripheral portion of the contact layer 8. It is noted that the bottom, the side face and the top face of the burying layer 9 of BCB is covered with a protecting film 12 of, for example, silicon oxide that has higher hardness and more stable than BCB in this embodiment, so as to improve the reliability of the semiconductor laser device.

The burying layer 9 is preferably made of a dielectric with a dielectric constant (relative dielectric constant) smaller than 4. Specifically, for example, when silicon oxide with a dielectric constant of approximately 3.9, polyimide with a dielectric constant of approximately 3.3 and BCB with a dielectric constant of approximately 2.5 are used, the parasitic capacitance of the burying layer 9 can be reduced, so as to improve the high-frequency characteristics of the semiconductor laser device.

Now, a method for forming the quantum well active layer 4 of this embodiment and features thereof will be described with reference to the accompanying drawings.

Figure 2:
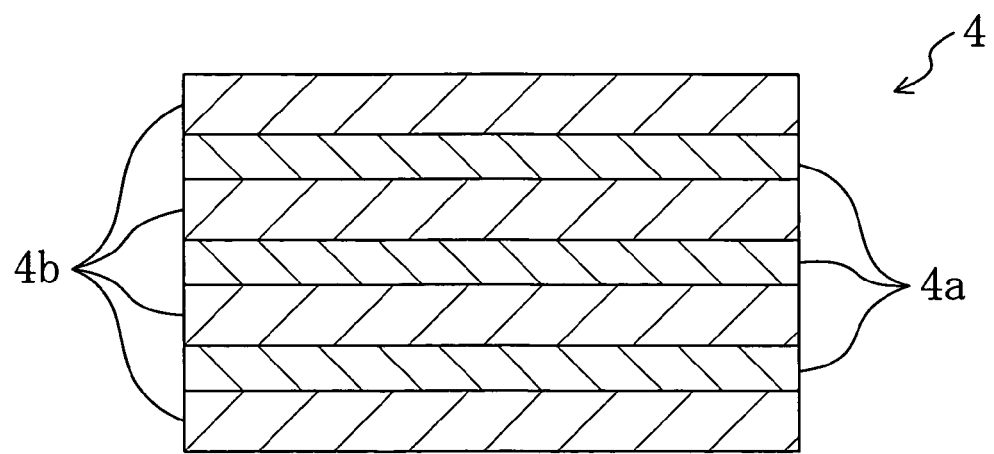
FIG. 2 is an enlarged cross-sectional view of a quantum well active layer of the optical semiconductor device of the embodiment.

FIG. 2 is a schematic enlarged cross-sectional view of the quantum well active layer 4 of FIG. 1. As shown in FIG. 2, the quantum well active layer 4 is constructed by alternately stacking, for example, three compression strain quantum well layers 4a of $Al_{0.14}Ga_{0.73}In_{0.13}As$ each with a thickness of approximately 6 nm and four extension strain barrier layers 4b of $Al_{0.1}Ga_{0.9}As_{0.75}P_{0.25}$ (which is composition of a center portion along the thickness direction) each with a thickness of approximately 8 nm.

In this embodiment, the compression strain quantum well layer 4a is made of AlGaInAs having compression strain of approximately +1.0% with respect to the substrate 1 of n-type GaAs. On the contrary, the composition of the composing elements of the extension strain barrier layer 4b is controlled so that the extension strain can be distributed within the barrier layer 4b, and the extension strain barrier layer 4b is made of AlGaAsP having extension strain of approximately −1.0% at most.

In other words, in the strain compensation quantum well structure employed in this embodiment, the compression strain quantum well layer 4a is made of $Al_{0.14}Ga_{0.73}In_{0.13}As$ with no composition modulation and the extension strain barrier layer 4b has the composition in which composition ratios of the group V elements and the group III elements are modulated for preventing arsenic (As) from releasing from the compression strain quantum well layer 4a, for preventing arsenic (As) or phosphorus (P) from releasing from the extension strain barrier layer 4b and for preventing phosphorus (P) from diffusing from the extension strain barrier layer 4b to the compression strain quantum well layer 4a.

Figure 3:
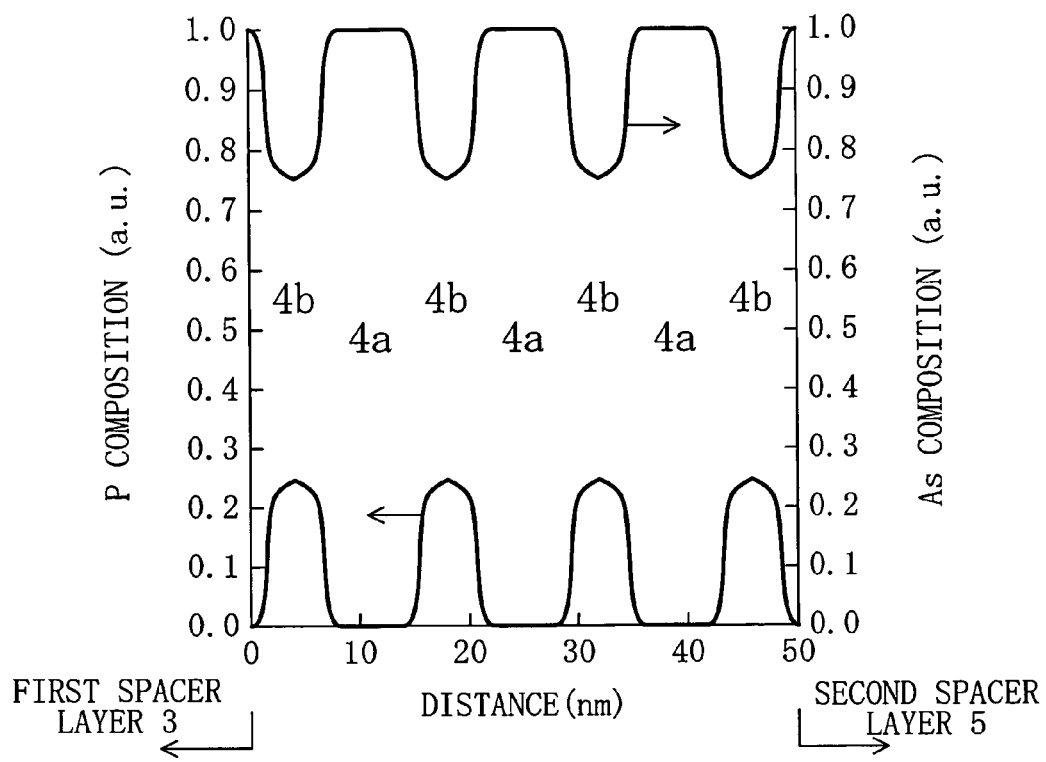
FIG. 3 is a graph for showing composition distributions of group V elements in the quantum well active layer of the optical semiconductor device of the embodiment.
Figure 4:
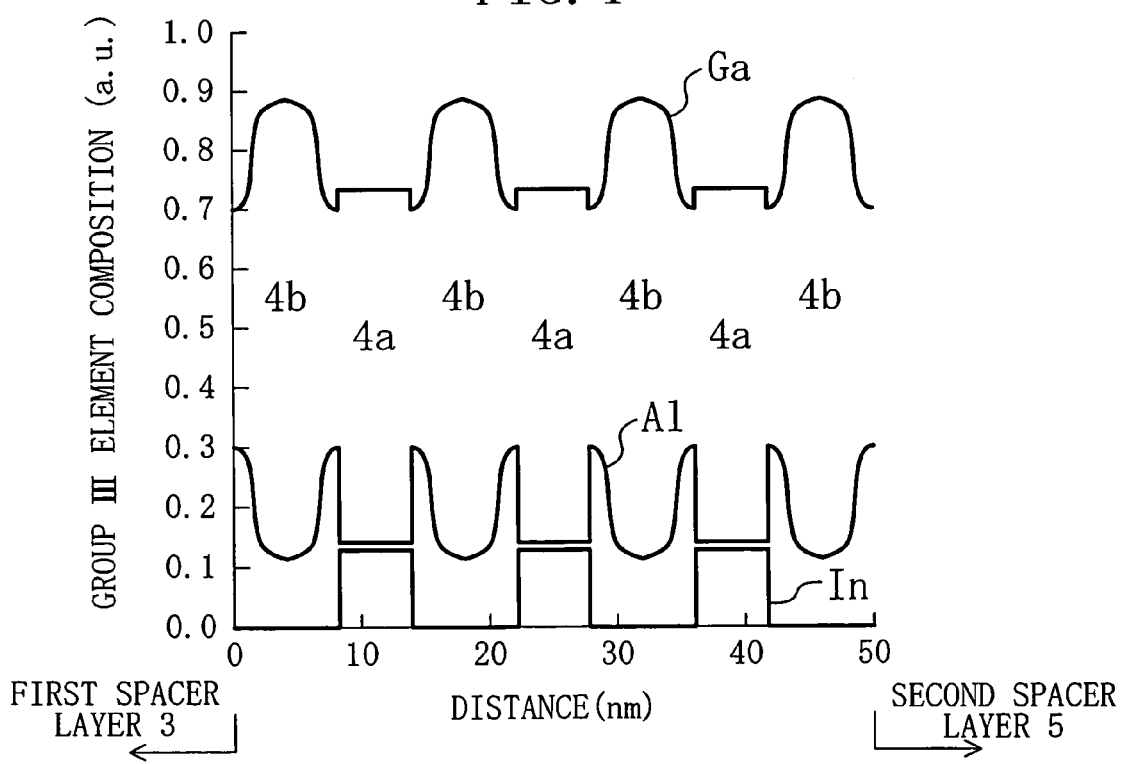
FIG. 4 is a graph for showing composition distributions of group III elements in the quantum well active layer of the optical semiconductor device of the embodiment.

FIG. 3 shows the composition distributions of the group V elements in the quantum well active layer 4 and FIG. 4 shows the composition distributions of the group III elements in the quantum well active layer 4. In FIGS. 3 and 4, a reference numeral 4a denotes the composition distributions of phosphorus (P) and arsenic (As), that is, the group V elements, in the compression strain quantum well active layer 4a, and a reference numeral 4b denotes the composition distributions of phosphorus (P) and arsenic (As), that is, the group V elements, in the extension strain barrier layer 4b.

As shown in FIG. 3, between the growth process for the compression strain quantum well layer 4a and the growth process for the extension strain barrier layer 4b, while continuously supplying arsenic (As), the supply amount of phosphorus (P) is gradually increased immediately after the start of the growth and is gradually reduced before the end of the growth. Therefore, the growth process for the compression strain quantum well layer 4a and the growth process for the extension strain barrier layer 4b can be performed without interruption. As a result, the release of As or P from the crystal during the interruption between the growth process for the compression strain quantum well layer 4a and the growth process for the extension strain barrier layer 4b can be avoided. Accordingly, the controllability of the composition of the group V elements (that is, As and P) can be improved, so that the quantum well active layer 4 can attain high gain.

Figure 5:
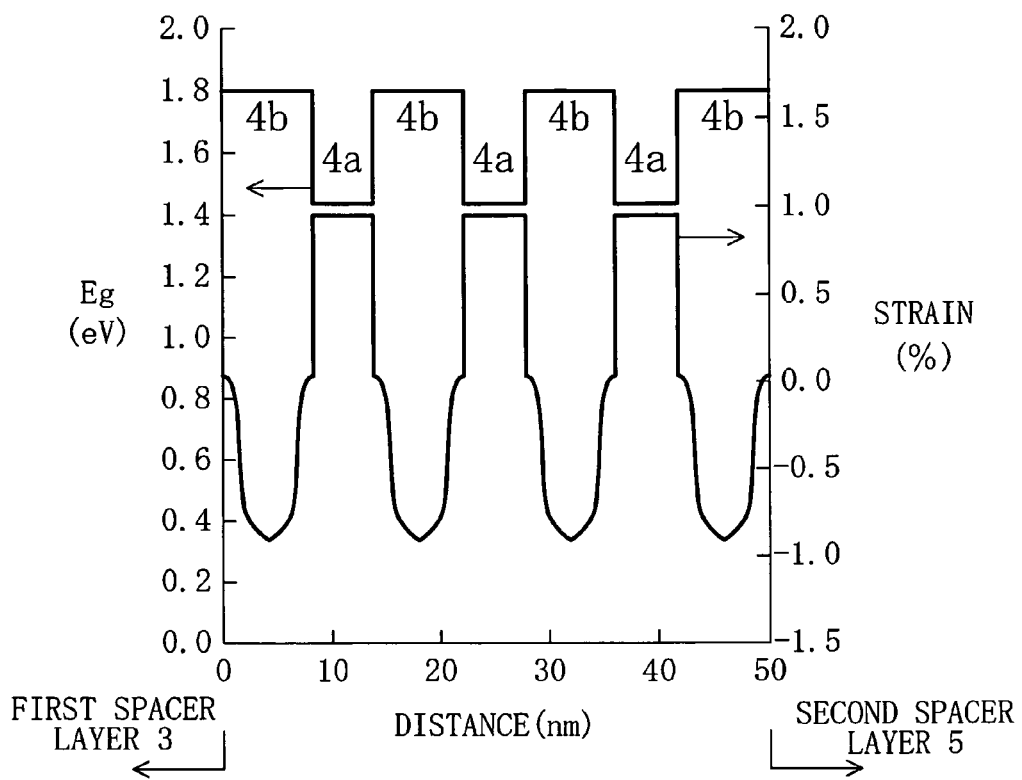
FIG. 5 is a graph for showing a band gap and strain along the thickness direction of the quantum well active layer of the optical semiconductor device of the embodiment.

FIG. 5 shows the band gaps with constant values of each compression strain quantum well layer 4a and each extension strain barrier layer 4b and the strain of the extension strain barrier layer 4b changed in a range of approximately 0% through −1% so as to make the band gap have a constant value of, for example, approximately 1.8 eV. In FIG. 5, strain with a positive value corresponds to compression strain and strain with a negative value corresponds to extension strain.

In this embodiment, the extension strain is adjusted so that the band gap of the extension strain barrier layer 4b has a constant value. This adjustment is carried out by appropriately modulating the composition ratios of the group III elements (Al and Ga) and the group V elements (As and P) included in the extension strain barrier layer 4b as shown in FIGS. 3 and 4. It is noted that the starting point of a distance indicated by the abscissa of each graph of FIGS. 3 through 5 corresponds to the top face of the first spacer layer 3.

Figure 6:
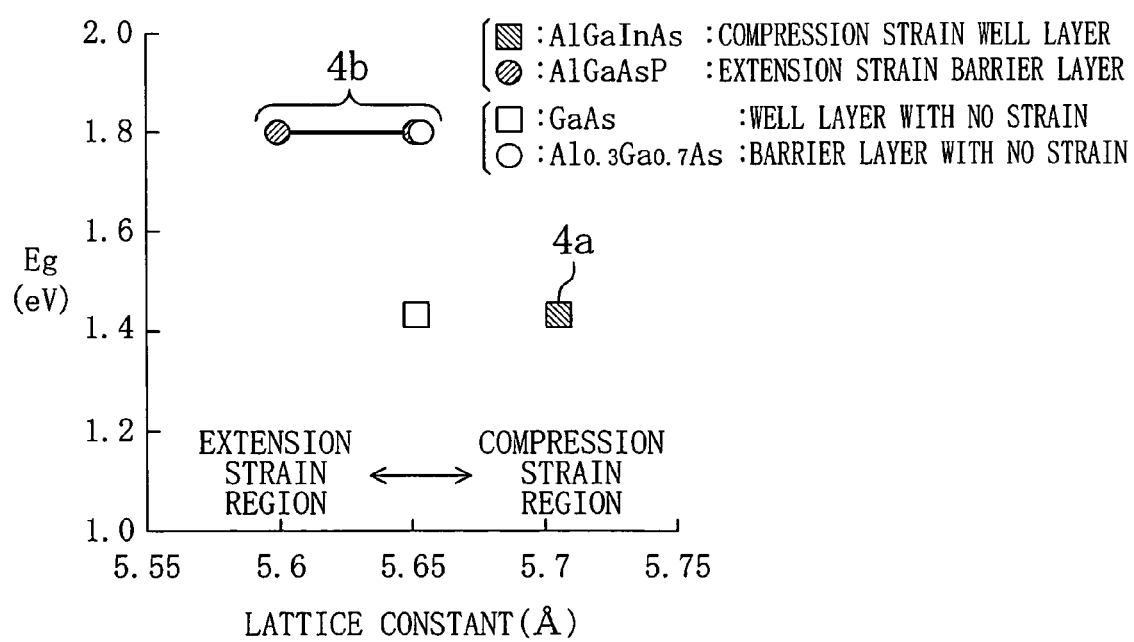
FIG. 6 is a graph for showing lattice constants and band gaps of a compression strain well layer and an extension strain barrier layer modulated in the composition included in the quantum well active layer of the optical semiconductor device of the embodiment.

FIG. 6 shows the relationship between the lattice constants and the band gaps of the compression strain quantum well layer 4a and the extension strain barrier layer 4b modulated in the composition included in the quantum well active layer 4 of this embodiment. It is noted that data of a well layer with no strain and a barrier layer with no strain are also shown for comparison in FIG. 6. As shown in FIG. 6, although both the lattice constant and the band gap are not changed in the compression strain quantum well layer 4a, the lattice constant is controlled by modulating the composition in the extension strain barrier layer 4b so as to attain a constant band gap of 1.8 eV.

As described so far, according to this embodiment, the growth process for the compression strain quantum well layer 4a and the growth process for the extension strain barrier layer 4b of the so-called strain compensation multiple quantum well structure are performed without interruption. Therefore, arsenic (As) can be prevented from releasing from the compression strain quantum well layer 4a. Furthermore, in the growth process for the extension strain barrier layer 4b, the composition ratios of the group V elements (As and P) and the group III elements (Al and Ga) are gradually changed so as to prevent arsenic (As) from releasing from the quantum well layer.

Moreover, since the composition ratios of the group V elements (As and P) and the group III elements (Al and Ga) are gradually changed, in other words, since the supply amount of phosphorus (P) is gradually reduced, also during the transit from the growth of the extension strain barrier layer 4b to the growth of the compression strain quantum well layer 4a in the continuous growth process, the diffusion of the phosphorus (P) into the compression strain quantum well layer 4a can be suppressed.

Accordingly, in the semiconductor laser device of this embodiment, the compression strain quantum well layer 4a can be formed with uniform composition while causing the extension strain in the extension strain barrier layer 4b, and thus, high gain can be realized. As a result, the threshold current is reduced, so as to improve the luminous efficiency.

Although the quantum well active layer 4 includes the three compression strain quantum well layers 4a and the four extension strain barrier layers 4b in this embodiment, the present invention is not limited to this structure.

Also, although the surface emitting type semiconductor laser device is described as an example of the optical semiconductor device, the present invention is not limited to the surface emitting type semiconductor laser device. Specifically, the present invention is applicable to any optical semiconductor device including an active layer with a strain compensation quantum well structure.

As described above, according to the optical semiconductor device and the fabrication method for the same of this invention, the controllability of semiconductor composition on an interface between a well layer and a barrier layer of an active layer having a strain compensation quantum well structure is improved so that the active layer can attain high gain. Thus, the invention is useful for, for example, a vertical cavity surface emitting laser device or the like for use in optical communication with an oscillation wavelength of approximately 850 nm.

What is claimed is:

1. An optical semiconductor device comprising:
   an active layer having a quantum well structure including alternately stacked well layers and barrier layers, wherein a bandgap of said barrier layers is larger than a bandgap of said well layers,
   wherein each of said well layers and said barrier layers has a constant band gap,
   said active layer is made of a group III-V compound semiconductor,
   wherein a content of each of group III elements and group V elements is uniform in each of said well layers regardless of a position therein,
   wherein a content of each of group III elements and group V elements is varied along the thickness direction in each of said barrier layers,
   each of said well layers is made of AlGaInAs and each of said barrier layers is made of AlGaAsP,
   wherein contents of said AlGaAsP are modulated in each of said barrier layers,
   Ga and P contents in each of said barrier layers are increased in a center portion thereof in the thickness direction and reduced in a portion thereof in the vicinity of said well layer.

2. The optical semiconductor device of claim 1, wherein each of said well layers is uniformly provided with compression strain and each of said baffler layers is provided with large extension strain in a center portion thereof along the thickness direction and small extension strain in portions thereof in the vicinity of said well layers.
   wherein said extension strain provided to each of said barrier layers is distributed symmetrically along the thickness direction.

3. The optical semiconductor device of claim 1, wherein said active layer is formed over a substrate made of GaAs.

4. The optical semiconductor device of claim 3, further comprising a first reflecting layer and a second reflecting layer each made of a multilayered film of AlGaAs and together sandwiching said active layer along the thickness direction.

5. The optical semiconductor device of claim 4, further comprising an oxidized layer formed by oxidizing AlGaAs in at least one of a position between said active layer and said first reflecting layer and a position between said active layer and said second reflecting layer,
   wherein a content of Al in said oxidized layer is higher than a content of Al in said well layers, said barrier layers, said first reflecting layer and said second reflecting layer.

6. The optical semiconductor device of claim 4,
   wherein said active layer, said first reflecting layer and said second reflecting layer are formed in the shape of a column,
   a first electrode and a second electrode are respectively formed above and below said active layer in the shape of a column, and
   emitted light from said active layer generated by a current injected from said first electrode or said second electrode is taken out through said first reflecting layer or said second reflecting layer.

7. The optical semiconductor device of claim 6, further comprising a dielectric film with a dielectric constant smaller than 4 formed around said active layer, said first reflecting layer and said second reflecting layer formed in the shape of a column.

8. The optical semiconductor device of claim 7, wherein said dielectric film is made of benzocyclobutene (BCB).

* * * * *